United States Patent [19]
Tanis et al.

[11] Patent Number: 5,258,724
[45] Date of Patent: Nov. 2, 1993

[54] FREQUENCY SYNTHESIZER

[75] Inventors: William J. Tanis, Wayne; Ning H. Lu, Parsippany; Alan N. Schenberg, Kinnelon, all of N.J.

[73] Assignee: ITT Corporation, New York, N.Y.

[21] Appl. No.: 566,947

[22] Filed: Dec. 30, 1983

[51] Int. Cl.$^5$ .................. H03L 7/22; H03B 19/00
[52] U.S. Cl. .................. 331/1 A; 331/10; 331/25; 328/14
[58] Field of Search .................. 331/1 A, 11, 25

[56] References Cited

U.S. PATENT DOCUMENTS

| | | | |
|---|---|---|---|
| 3,382,451 | 5/1968 | Gillette et al. | 330/147 |
| 3,555,446 | 1/1971 | Braymer | 331/16 |
| 3,582,810 | 6/1971 | Gillette | 331/10 |
| 3,628,160 | 12/1971 | Pickering | 328/144 |
| 3,689,914 | 9/1972 | Butler | 340/347 |
| 3,959,737 | 5/1976 | Tanis | 331/1 |
| 4,069,452 | 1/1978 | Conway et al. | 324/103 |
| 4,472,820 | 9/1984 | Borras | 331/1 A X |

OTHER PUBLICATIONS

"Frequency Synthesis in a Microwave Signal Generator", K. L. Astrof, Hewlett Packard Journal, Nov. 1977, pp. 8–15.
"A High-Purity, Fast Switching Synthesized Signal Generator", R. Hassun, Hewlett Packard Journal, Feb. 1981, pp. 3–7.
"Digital Control for a High-Performance Programmable Signal Generator", H. C. Chisholm, Hewlett Packard Journal, Feb. 1981, pp. 8–11.

Primary Examiner—Gilberto Barron, Jr.
Attorney, Agent, or Firm—Thomas N. Twomey; Patrick M. Hogan

[57] ABSTRACT

The fractional division frequency synthesizer comprises a digital ramp generator producing a digital correction ramp controlled by a frequency control programmer; a divide by N divider coupled to an output of a voltage controlled oscillator with the divider being controlled by the program, where N is a selected one of an integer and a fraction one or greater; a digital phase detector coupled to a reference clock and the output of the divider to provide a digital phase error signal; a digital adder coupled to an output of the ramp generator and the phase detector to produce a ramp corrected digital phase error signal; and circuit arrangement coupled to an output of the adder and a control input of the controlled oscillator to convert the ramp corrected digital phase error signal to a ramp corrected analog phase error signal to control the controlled oscillator and thereby provide a controlled frequency signal at the output thereof.

12 Claims, 2 Drawing Sheets

5,258,724

FREQUENCY SYNTHESIZER

BACKGROUND OF THE INVENTION

The present invention relates to frequency synthesizers and more particularly to a fractional division frequency synthesizer of the indirect synthesis type.

Frequency synthesizers fall into two general classes. The first class is a direct frequency synthesis where new frequencies are derived from a single reference frequency by means of combinations of several additions, subtractions, multiplications and divisions of the reference frequency. This method is very complex and such a synthesizer is very expensive requiring a large number of passive and active elements.

A second class of synthesizer employs indirect frequency synthesis wherein new frequencies are derived from a single reference frequency by means of programmable phase-lock loops which contain whole number frequency dividers. If small steps in output frequency are necessary, then several phase-lock loops are employed, the output of one loop being divided and then added to or subtracted from the next. In other words, the output frequency of the synthesizer is divided down to the lower frequency for phase comparison with a reference frequency. A digital divider with an integer divisor provides an output frequency resolution which is directly related to the reference frequency. As higher resolution is needed, the reference frequency must be lowered. With a lower reference frequency, the short-term stability decreases and the phase-noise increases.

When short-term stability must be high and phase-noise low, a complex, multiple phase-lock loop system must be employed. Unfortunately, such multiple-loop, prior art synthesizers are expensive and complicated and it is very difficult to control spurious signals which may occur at many different frequencies, both close to or far away from the carrier frequency.

The problem, then, is to provide a frequency synthesizer which does not suffer from the above-mentioned defects. This problem has been solved by the frequency synthesizer disclosed in U.S. Pat. No. 3,959,737 of W. J. Tanis, one of the inventors of the instant application, the disclosure thereof being incorporated herein by reference. In the synthesizer of the above-identified Patent the digital divider in the phase-locked loop is effectively made to divide in fractional steps so that a much higher reference frequency may be employed than used in the prior art systems. This permits the use of only one main phase-locked loop, in the aforementioned synthesizer or section thereof, thus holding generation of spurious signals to a minimum. A secondary loop, used for the fractional dividing, does produce some close-to-the-carrier spurious signals, but if unacceptable this is effectively reduced by means of a tuneable frequency discriminator, or a sideband reduction ramp generator or a combination of both.

The frequency synthesizer of the above-identified U.S. Patent includes a voltage-tuned oscillator, the output frequency of which is proportional to a DC (direct current) potential applied to the tuning port thereof. The synthesizer also includes a digital divider connected to the output of the voltage-tuned oscillator, the digital divider dividing the output frequency of the voltage-tuned oscillator by a factor of N, where N is an integer or fractional number greater than one. The circuit includes means, connected to the digital divider, for altering the value of the factor N and a source of a reference frequency signal. Means, connected to the output of the digital divider and to the source of the reference signal, to compare the phase of the reference frequency signal with a phase of the divided output of the voltage-tuned oscillator thereby generating an error signal if there is any phase difference detected. The synthesizer also includes means for supplying the error voltage to the tuning port of the voltage-tuned oscillator whereby the oscillator alters its output frequency, and hence the output frequency of the synthesizer, in an offsetting manner to reduce the error signal towards zero. The operation of the fractional divider produces an unwanted, low-frequency ramp signal which is super-imposed upon the correction signal when there is a phase difference between the reference signal and the divided output signal of the voltage-tuned oscillator. It is this ramp signal that tends to produce spurious sidebands in the RF (radio frequency) output signal from the synthesizer. To eliminate this problem, the synthesizer further includes a sideband reduction circuit which is connected to the output of the fractional divider and to an intermediate output thereof. The output of the sideband reduction circuit is connected to the second input of a summing amplifier. The sideband reduction circuit reduces the effect of the unwanted ramp signal by providing a nulling ramp signal of opposite phase. The sideband reduction circuit and removal of the unwanted ramp signal is accomplished using analog techniques.

Variations of the frequency synthesizer of the above-identified U.S. Patent all have used an analog correction ramp and analog summing.

SUMMARY OF THE INVENTION

An object of the present invention is to provide a frequency synthesizer of the fractional division type employing a digital phase detector to detect phase differences between a reference frequency and the divided output of the voltage controlled oscillator with the ramp correction being obtained by summing the binary word of the phase detector with a digital correction ramp before conversion of the resultant sum to an analog signal for frequency control of the voltage control oscillator.

A feature of the present invention is the provision of a fractional division frequency synthesizer comprising a voltage controlled oscillator having an output to provide a controlled frequency signal; a digital ramp generator to produce a digital correction ramp in response to a frequency control program; a divide by N divider coupled to the output of the controlled oscillator, the divider being controlled by the program, where N is a selected one of an integer and a fraction one or greater; a digital phase detector coupled to a reference frequency and to an output of said divider to provide a digital phase error signal; a digital adder coupled to an output of the ramp generator and the phase detector to produce a ramp corrected digital phase error signal; and circuit means coupled to an output of the adder and a control input of the controlled oscillator to convert the digital phase error signal to a ramp corrected analog phase error signal to control the voltage controlled oscillator and thereby provide the controlled frequency signal.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figure 1:
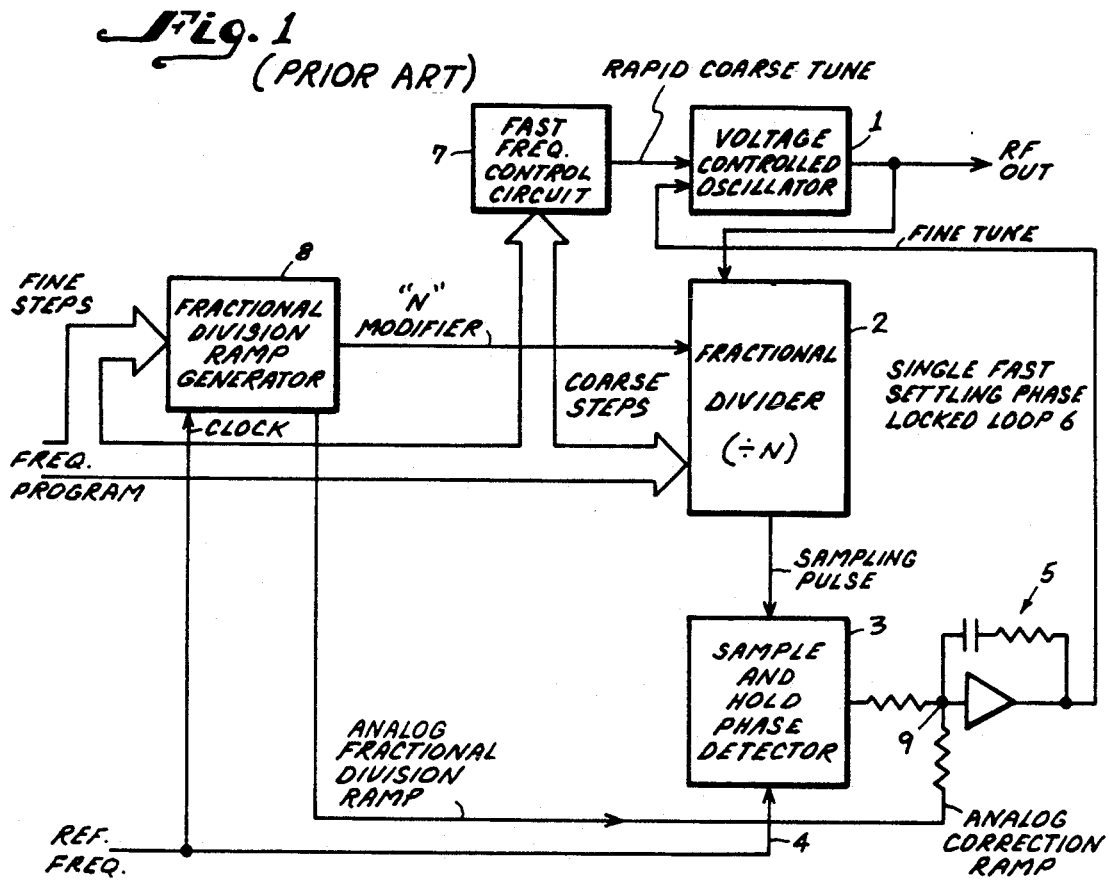
FIG. 1 is a block diagram of an implementation of the prior art fractional division frequency synthesizer as disclosed in the above cited U.S. patent.

Referring to FIG. 1, the prior art fractional division frequency synthesizer includes a voltage controlled oscillator 1 whose output provides the output of the frequency synthesizer and whose output is also coupled to a fractional divider 2 controlled by a frequency selecting program. The output of fractional divider 2 is a sampling pulse which is coupled to an analog sample and hold phase detector 3 in which the sampling pulse is phase compared with a reference frequency on conductor 4 coupled to the other input of phase detector 3. The output of phase detector 3 is an analog error signal proportional to the phase difference between the sampling pulse and the reference frequency. This error signal is applied to an integrater and amplifier 5, the output of which is coupled to the tuning input of oscillator 1 to fine tune oscillator 1 to reduce the error signal and the output of phase detector 3 at least toward zero.

In certain applications it may be necessary to fast tune the voltage controlled oscillator 1 so as to bring the fractionally divided output of oscillator 1 into the capture range of the phase locked loop. This is accomplished by the fast frequency control circuit 7 which is controlled by the frequency program.

As mentioned hereinabove the results of the fractional divider 2 causes a ramp signal which is unwanted. This unwanted, low-frequency ramp signal is cancelled or at least greatly reduced by the production of an analog fractional division ramp in the analog fractional division ramp generator 8 which is under control of the frequency program and which is coupled to fractional divider 2 to provide a modifier for the divisor N. The analog correction ramp produced by generator 8 is added to the output of the phase detector 3 at point in loop 9 so as to cancel the ramp signal produced by divider 2. The ramp produced by generator 8 is in phase opposition to the ramp produced by divider 2 to thereby provide the necessary reduction of the ramp so as to reduce the unwanted spurious sidebands in the RF output signal from oscillator 1.

The correction ramp must have a precisely controlled slope in order to cancel out FM (frequency modulation) sidebands of the RF output of oscillator 1 generated in the fractional divider 2. Errors of 1 percent in slope can cause FM sidebands to appear at a level approximately 40 dB (decibel) below the carrier. Variations in the analog ramp level and in the summing circuit, therefore, affect the FM sideband levels.

The time that the analog correction ramp is reset, ideally, should correspond exactly to the time that the loop error ramp caused by divider 2 resets. In addition, the corresponding slopes should exactly compliment each other. These conditions are practically impossible to obtain; hence, imperfect correction is obtained. A technique used by Hewlett-Packard combines the reference ramp and the correction ramp before sampling in the phase detector for the purpose of "hiding" the reset inaccuracies. This scheme does hide the reset inaccuracies, but when high-frequency ramps are required linear combining to better than a few percent of linearity is practically impossible.

Non-linearities in the phase detector affect the linearity of the error ramp present in the loop during fractional division making the error ramp and consequent FM sidebands difficult to null out.

Figure 2:
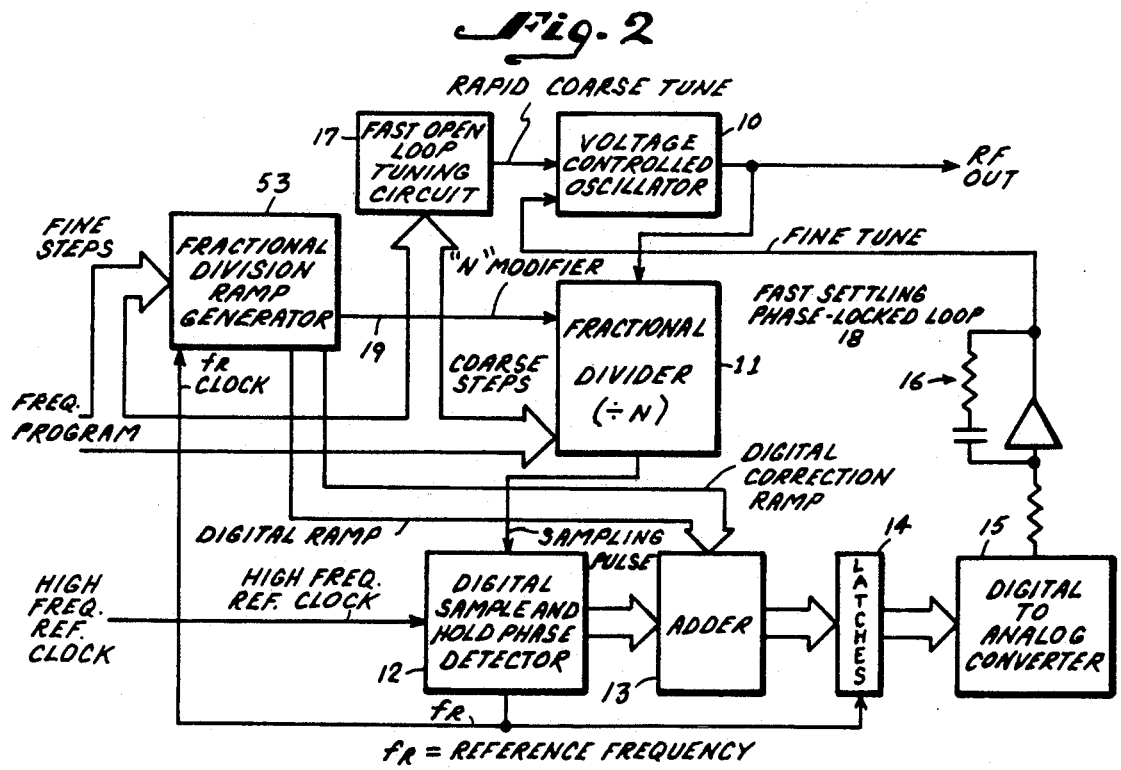
FIG. 2 is a block diagram of the fractional division frequency synthesizer in accordance with the principles of the present invention.

Referring to FIG. 2, there is illustrated therein in block diagram for a fractional division frequency synthesizer in accordance with the principles of the present invention. The frequency synthesizer of FIG. 2 is substantially identical to that of FIG. 1 except that the phase detection and the ramp correction is digital in nature.

The frequency synthesizer of FIG. 2 includes a voltage controlled oscillator 10 whose output provides the RF output of the frequency synthesizer and is likewise coupled to the fractional divider 11, an embodiment of which is disclosed in the above cited U.S. patent. The sampling pulse output of divider 11 is coupled to a digital sample and hold phase detector 12 wherein the sampling pulse is compared to the reference frequency (a quotient of the high frequency reference clock) to detect any phase error that may be present at the output of divider 11 to produce a digital word proportional to this phase error. As mentioned hereinabove the fractional dividing process carried out in divider 11 causes an unwanted ramp signal. This unwanted ramp signal is removed in the embodiment of FIG. 2 by employing a fractional division ramp generator 13 which is controlled by the frequency program used to control frequency divider 11 to produce a digital correction ramp in the form of a digital word which is then combined in adder 13 with the digital word output of phase detector 12 proportional to the phase error in such a manner that the digital correction ramp is in phase opposition to the unwanted ramp signal at the output of phase detector 12 so as to cancel this unwanted ramp signal or at least reduce it to a value as low as possible. The resultant ramp corrected digital phase error signal at the output of adder 13 is coupled to latches 14 and, hence, to a digital to analog converter 15 wherein the digital ramp corrected phase error signal is converted to a ramp corrected analog phase error signal for application to the amplifier/integrater 16 whose output is then coupled to the tuning port of oscillator 10 to fine tune oscillator 10 so as to null out the phase error signal.

The output of phase detector 12 is a digital word representative of phase variations between the reference frequency or clock and the sampling pulse at the output of divider 11. This digital word is not subject to linearity and temperature problems as is the case with an analog phase detector. The digital correction ramp is a digital word (incremented or decremented as required), properly scaled, that is summed with the digital phase detector output in adder 13. Except for least significant bit fluctuations, under settled conditions, the output to the digital to analog converter 15 is a steady digital word.

Providing the correction ramp incrementing rate is not too great for the digital adder to handle, and the full required number of bits are used, correction errors are not present in the output word of adder 13. Non-linearities in the analog circuits have no effect, since the total error has been subtracted out digitally. If truncation of the correction ramp least significant bit is implemented, error ramp cancellation will not be complete and FM sidebands will occur. The allowable sidebands levels will determine the amount of truncation that is acceptable.

A fast open-loop tuning circuit 17 is required in some applications to tune the oscillator 10 within the locking frequency range of the phase locked loop 18.

Ramp generator 53 generates a digitally incrementing (or decrementing) word that eventually overflows and resets, forming a digital "ramp". At the time of ramp reset, a pulse is formed that effectively adds or deletes voltage controlled oscillator cycles being processed in the divider 11. This pulse is coupled from generator 53 to divider 11 on conductor 19. Under locked-loop conditions, N is thus effectively made fractional.

Figure 3:
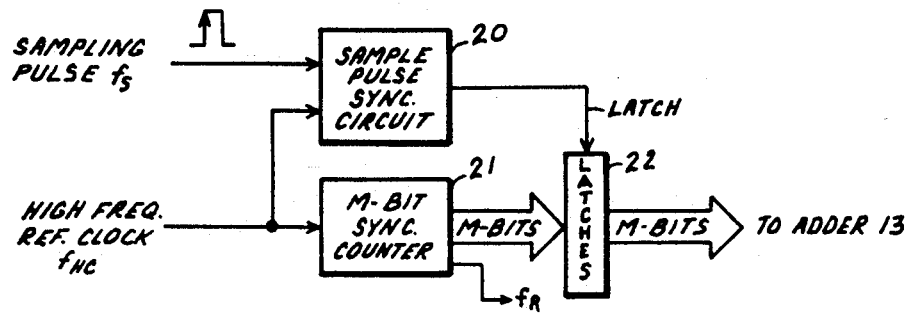
FIG. 3 is a block diagram of one embodiment of the digital sample and hold phase detector of the frequency synthesizer of FIG. 2.

Referring to FIG. 3, there is illustrated therein one embodiment of the digital sample and hold phase detector 12 of FIG. 2. The sampling pulse from divider 11 of FIG. 2 is synchronized with the high frequency reference clock in circuit 20 and the high frequency reference clock is counted in the M-bit synchronous counter 21. The synchronized sampling pulse at the output of circuit 20 is then used to latch the accumulated contents of counter 21 in latches 22 until the next sampling pulse arrives, at which time the latches 22 are updated. The data stored in latches 22 would then be coupled to adder 13 of FIG. 2 and is a digital word which is proportional to the time delay (or phase difference) between reset of counter 21 and the time the sampling pulse appears.

The high frequency reference clock drives the synchronous counter 21 which increments or decrements its binary output data word after each clock pulse. Counter 21 reaches terminal count and resets at the rate of $f_R = f_{HC}/2^M$, where $f_{HC}$ is the frequency of the high frequency reference clock and M is the number of counter 21 bits from counter 21. The incrementing output word of counter 21 is often referred to as the reference frequency $f_R$ or reference "ramp". Under normal steady state conditions the frequency of the sampling pulse train $f_s$ equals the reference frequency $f_R$.

The phase detector of FIG. 3 has a full $2\pi$ radian dynamic range with an output resolution of $2\pi/2^M$ radians of phase. A signal having a pulse rate of $f_R$ is normally available from counter 21 at the time of terminal count or reset. This is useful in some applications as it is in the instant invention.

Figure 4:
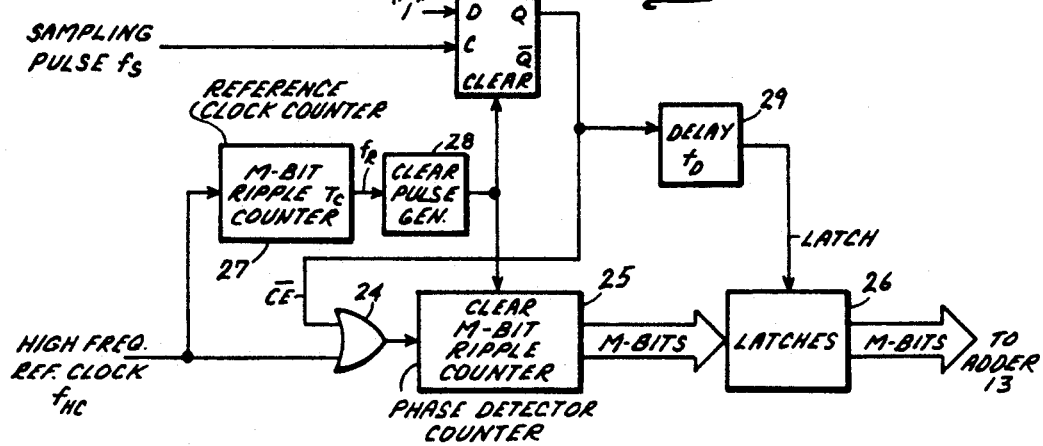
FIG. 4 is a block diagram of a second embodiment of the digital sample and hold phase detector of FIG. 2.

Referring to FIG. 4, there is illustrated therein a block diagram of an alternative arrangement for phase detector 12 employing ripple counters instead of synchronous counters. Ripple counters can work at gigahertz rates. In this configuration, after the sampling pulse arrives and triggers the flip flop 23 the Q output therefrom is coupled to OR gate 24 to inhibit the high frequency reference clock from clocking the phase detector counter 25.

The Q output of flip flop 23 is normally low or logic "0" and when the sampling pulse clocks flip flop 23 the Q output becomes high or logic "one". Thus, when one input to or gate 24 is high upon the occurrence of the sampling pulse the high frequency reference clock is blocked by gate 24 and cannot clock the counter 25. Time is allowed for the ripple counter data outputs to stabilize after which the data is latched in latches 26. A second M-bit ripple counter 27 produces a reference frequency clock $f_R$ which clears the phase detector counter 25 and flip flop 23 and restarts the counter cycle via the flip flop 23 and gate 24. The clear pulse for clearing flip flops 23 and counter 25 is produced in clear pulse generator 28. Delay circuit 29 delays the leading edge of the sampling pulse by a time $t_D$ until ripple counter 25 outputs have time to stabilize.

As the frequency increases, the time ($t_D$) it takes for the ripple counter 25 to stabilize becomes a significant portion of reference frequency period and the dynamic range of the phase detector becomes limited. The dynamic range can be defined as $R = [(T_R - t_D)/T_R] (2\pi)$ radians, where $T_R = 1/f_R$.

Figure 5:
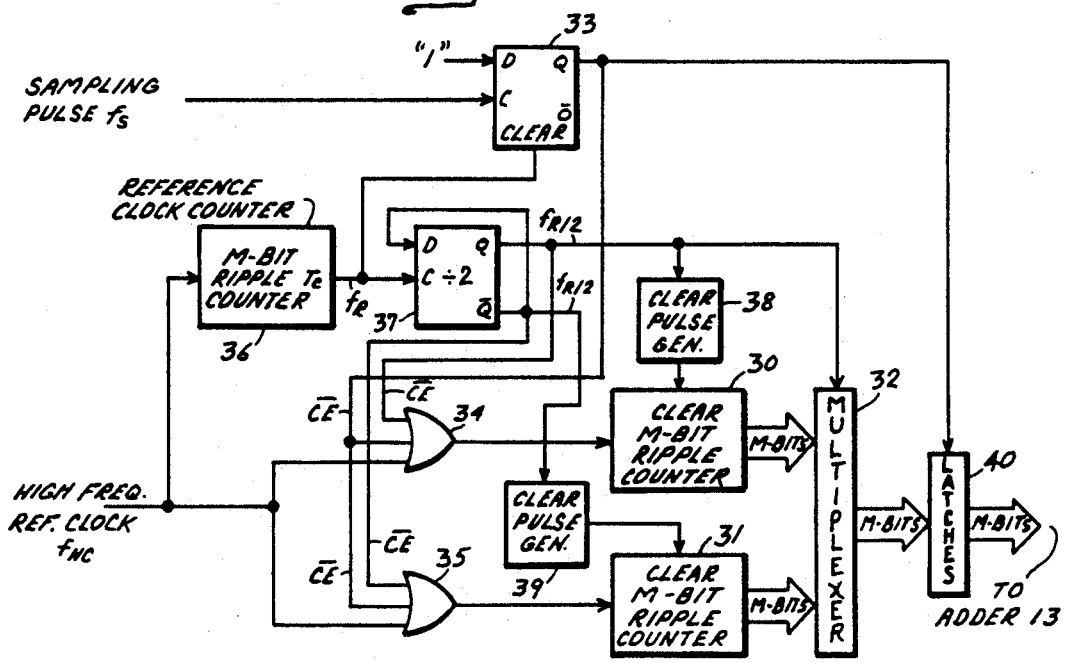
FIG. 5 is a block diagram of a third embodiment of a digital sample and hold phase detector of the frequency synthesizer of FIG. 2.

If the range limitation is unacceptable, the arrangement of FIG. 5 may be employed wherein two ripple counters 30 and 31 are employed as the phase detector counters with the outputs of these two counters 30 and 31 being multiplexed in multiplexer 32. As in FIG. 4 the sampling pulse is coupled to flip flop 33 whose Q output is coupled to OR gates 34 and 35 for controlling the input of the high frequency clock to ripple counters 30 and 31. Ripple counter 36 provides the reference clock $f_R$ from the high frequency reference clock and is divided by two in flip flop 37 with the Q output of flip flop 37 being coupled to OR gate 34 and the $\overline{Q}$ output of flip flop 37 being coupled to OR gate 35. The inputs from flip flop 37 to gates 34 and 35 control counter 30 to count at one time while counter 31 is settling and vice versa. The output of counter 36 controls the clearing of flip flop 33 and clear pulse generators 38 and 39 responsive to the Q and $\overline{Q}$ outputs of flip flop 37 which in turn control the clearing of counters 30 and 31, respectively. The Q output of flip flop 37 controls multiplexer 32 and the Q output of flip flop 33 controls the latches 40 whose output are coupled to the adder 13 of FIG. 2.

While we have described above the principles of our invention in connection with specific apparatus, it is to be clearly understood that this description is made only by way of example and not as a limitation to the scope of our invention as set forth in the objects thereof and in the accompanying claims.

We claim:
1. A fractional division frequency synthesizer comprising:
   a voltage controlled oscillator having an output to provide a controlled frequency signal;
   a divide by N divider coupled to said output of said controlled oscillator, said divider being controlled by a frequency control program, where N is a selected one of an integer and a fraction one or greater;
   a digital ramp generator to produce a digital correction ramp in response to said frequency control program and being coupled to a reference frequency and said divider;
   a digital sample and hold phase detector coupled to a high frequency reference clock and to an output of said divider to provide a digital phase error signal, said phase detector including
   a D-type flip flop coupled to said divider, a first M-bit ripple counter having a count input coupled to said high frequency reference clock, where M is an integer one or greater, a gate having a first input coupled to a non-inverting output of said flip flop and a second input coupled to said high frequency reference clock, said gate blocking passage of said high frequency reference clock when said flip flop is clocked by an output of said divider, a second M-bit ripple counter having a count input coupled to an output of said gate, a clear pulse generator coupled to an output of said first counter to produce a clear pulse coupled to a clear input of said flip flop and a clear input of said second counter, a delay circuit coupled to said non-inverting output of said flip flop, and latches coupled to an output of said second counter and an output of said delay circuit to provide an M-bit digital word as said digital phase error signal;

a digital adder coupled to an output of said ramp generator and said phase detector to produce a ramp corrected digital phase error signal; and circuit means coupled to an output of said adder and a control input of said controlled oscillator to convert said digital phase error signal to a ramp corrected analog phase error signal to control said controlled oscillator and thereby provide said controlled frequency signal, said circuit means including latch means coupled to said output of said adder and said reference frequency, and a digital to analog converter coupled to said latch means to provide said ramp corrected analog phase error signal.

2. A fractional division frequency synthesizer comprising:

a voltage controlled oscillator having an output to provide a controlled frequency signal;

a divide by N divider coupled to said output of said controlled oscillator, said divider being controlled by a frequency control program, where N is a selected one of an integer and a fraction one or greater;

a digital ramp generator to produce a digital correction ramp in response to said frequency control program and being coupled to a reference frequency and said divider;

a digital sample and hold phase detector coupled to a high frequency reference clock and to an output of said divider to provide a digital phase error signal, a digital adder coupled to an output of said ramp generator and said phase detector to produce a ramp corrected digital phase error signal; and circuit means coupled to an output of said adder and a control input of said controlled oscillator to convert said digital phase error signal to a ramp corrected analog phase error signal to control said controlled oscillator and thereby provide said controlled frequency signal, said circuit means including latch means coupled to said output of said adder and said reference frequency, and a digital to analog converter coupled to said latch means to provide said ramp corrected analog phase error signal, said phase detector including a D-type flip flop coupled to said divider, a first M-bit ripple counter having a count input coupled to said high frequency reference clock and an output coupled to a clear input of said flip flop, where M is an integer one or greater, a divide-by-two divider coupled to said output of said first counter having a non-inverting output and an inverting output, a first gate having a first input coupled to a non-inverting output of said flip flop, a second input coupled to said non-inverting output of said divide-by-two divider and a third input coupled to said high frequency reference clock to inhibit passage of said high frequency reference clock when one of said first and second inputs is logic "1", a second M-bit ripple counter having its count input coupled to an output of said first gate, a first clear pulse generator coupled between said non-inverting output of said divide-by-two divider and a clear input for said second counter to clear said second counter, a second gate having a first input coupled to said non-inverting output of said flip flop, a second input coupled to said inverting output of said divide-bytwo divider and a third input coupled to said high frequency reference clock to inhibit passage of said high frequency clock when one of said first and second inputs is logic "1", a third M-bit ripple counter having its count input coupled to an output of said second gate, a second clear pulse generator coupled between said inverting output of said divide-by-two divider and a clear input for said third counter to clear said third counter, a multiplexer coupled to outputs of said second and third counters and said non-inverting output of said divide-by-two divider, and latches coupled to an output of said multiplexer and said non-inverting output of said flip flop to provide an M-bit digital word as said digital phase error signal.

3. A fractional division frequency synthesizer comprising:

a voltage controlled oscillator having an output to provide a controlled frequency signal;

a divide by N divider coupled to said output of said controlled oscillator, said divider being controlled by a frequency control program, where N is a selected one of an integer and a fraction one or greater;

a digital ramp generator to produce a digital correction ramp in response to said frequency control program;

a digital phase detector coupled to a high frequency reference clock and to an output of said divider to provide a digital phase error signal;

a digital adder coupled to an output of said ramp generator and said phase detector to produce a ramp corrected digital phase error signal; and circuit means coupled to an output of said adder and a control input of said controlled oscillator to convert said digital phase error signal to a ramp corrected analog phase error signal to control said controlled oscillator and thereby provide said controlled frequency signal, said circuit means including latch means coupled to said output of said adder and said reference frequency, and a digital-to-analog converter coupled to said latch means to provide said ramp corrected analog phase error signal, said phase detector including a D-type flip flop coupled to said divider, a first M-bit ripple counter having a count input coupled to said high frequency reference clock, where M is an integer one or greater, a gate having a first input coupled to a non-inverting output of said flip flop and a second input coupled to said high frequency reference clock, said gate blocking passage of said high frequency reference clock when said flip flop is clocked by an output of said divider, a second M-bit ripple counter having a count input coupled to an output of said gate, a clear pulse generator coupled to an output of said first counter to produce a clear pulse coupled to a clear input of said flip flop and a clear input of said second counter, a delay circuit coupled to said non-inverting output of said flip flop, and latches coupled to an output of said second counter and an output of said delay circuit to provide an M-bit digital word as said digital phase error signal.

4. A fractional division frequency synthesizer comprising:

a voltage controlled oscillator having an output to provide a controlled frequency signal;

a divide by N divider coupled to said output of said controlled oscillator, said divider being controlled by a said frequency control program, where N is a selected one of an integer and a fraction one or greater;

a digital ramp generator to produce a digital correction ramp in response to said frequency control program;

a digital phase detector coupled to a high frequency reference clock and to an output of said divider to provide a digital phase error signal;

a digital adder coupled to an output of said ramp generator and said phase detector to produce a ramp corrected digital phase error signal; and circuit means coupled to an output of said adder and a control input of said controlled oscillator to convert said digital phase error signal to a ramp corrected analog phase error signal to control said controlled oscillator and thereby provide said controlled frequency signal, said circuit means including latch means coupled to said output of said adder and said reference frequency, and a digital-to-analog converter coupled to said latch means to provide said ramp corrected analog phase error signal, said phase detector including a D-type flip flop coupled to said divider, a first M-bit ripple counter having a count input coupled to said high frequency reference clock and an output coupled to a clear input of said flip flop, where M is an integer one or greater, a divide-by-two divider coupled to said output of said first counter having a non-inverting output and an inverting output, a first gate having a first input coupled to a non-inverting output of said flip flop, a second input coupled to said non-inverting output of said divide-by-two divider and a third input coupled to said high frequency reference clock to inhibit passage of said high frequency reference when one of said first and second inputs is logic "1", a second M-bit ripple counter having its count input coupled to an output of said first gate, a first clear pulse generator coupled between said non-inverting output of said divide-by-two divider and a clear input for said second counter to clear said second counter, a second gate having a first input coupled to said non-inverting output of said flip flop, a second input coupled to said inverting output of said divide-by-two divider and a third input coupled to said high frequency reference clock to inhibit passage of said high frequency reference clock when one of said first and second inputs is logic "0", a third M-bit ripple counter having its count input coupled to an output of said second gate, a second clear pulse generator coupled between said inverting output of said divide-by-two divider and a clear input for said third counter to clear said third counter, a multiplexer coupled to outputs of said second and third counters and said non-inverting output of said divide-by-two divider, and latches coupled to an output of said multiplexer and said non-inverting output of said flip flop to provide an M-bit digital word as said digital phase error signal.

5. A fractional division frequency synthesizer comprising:

a voltage controlled oscillator having an output to provide a controlled frequency signal;

a digital ramp generator to produce a digital correction ramp in response to a frequency control program;

a divide by N divider coupled to said output of said controlled oscillator, said divider being controlled by said program, where N is a selected one of an integer and a fraction one or greater;

a digital phase detector coupled to a high frequency reference clock and to an output of said divider to provide a digital phase error signal;

a digital adder coupled to an output of said ramp generator and said phase detector to produce a ramp corrected digital phase error signal; and circuit means coupled to an output of said adder and a control input of said controlled oscillator to convert said digital phase error signal to a ramp corrected analog phase error signal to control said controlled oscillator and thereby provide said controlled frequency signal; said phase detector including a D-type flip flop coupled to said divider, a first M-bit ripple counter having a count input coupled to said high frequency reference clock, where M is an integer one or greater, a gate having a first input coupled to a non-inverting output of said flip flop and a second input coupled to said high frequency reference clock, said gate blocking passage of said high frequency reference clock when said flip flop is clocked by an output of said divider, a second M-bit ripple counter having a count input coupled to an output of said gate, a clear pulse generator coupled to an output of said first counter to produce a clear pulse coupled to a clear input of said flip flop and a clear input of said second counter, a delay circuit coupled to said non-inverting output of said flip flop, and latches coupled to an output of said second counter and an output of said delay circuit to provide an M-bit digital word as said digital phase error signal.

6. A fractional division frequency synthesizer comprising:

a voltage controlled oscillator having an output to provide a controlled frequency signal;

a digital ramp generator to produce a digital correction ramp in response to a frequency control program;

a divide by N divider coupled to said output of said controlled oscillator, said divider being controlled by said program, where N is a selected one of an integer and a fraction one or greater;

a digital phase detector coupled to a high frequency reference clock and to an output of said divider to provide a digital phase error signal;

a digital adder coupled to an output of said ramp generator and said phase detector to produce a ramp corrected digital phase error signal; and circuit means coupled to an output of said adder and a control input of said controlled oscillator to convert said digital phase error signal to a ramp corrected analog phase error signal to control said controlled oscillator and thereby provide said controlled frequency signal;

said phase detector including a D-type flip flop coupled to said divider, a first M-bit ripple counter having a count input coupled to said high frequency reference clock, and an output coupled to a clear input of said flip flop, where M is an integer one or greater, a divide-by-two divider coupled to said output of said first counter having a non-inverting output and a inverting output, a first gate having a first input coupled to a non-inverting output of said flip flop, a second input coupled to said non-inverting output of said divide-by-two divider and a third input coupled to said high frequency reference clock to inhibit passage of said high frequency reference clock when one of said first and second inputs is logic "1", a second M-bit ripple counter having its count input coupled to an output of said first gate, a first clear pulse generator coupled between said non-inverting output of said divide-by-two divider and a clear input for said second counter to clear said second counter, a second gate having a first input coupled to said non-inverting output of said flip flop, a second input coupled to said inverting output of said divide-by-two divider and a third input coupled to said high frequency reference clock to inhibit passage of said high frequency reference clock when one of said first and second inputs is logic "1", a third M-bit ripple counter having its count input coupled to an output of said second gate, a second clear pulse generator coupled between said inverting output of said divide-by-two divider and a clear input for said third counter to clear said third counter, a multiplexer coupled to outputs of said second and third counters and said non-inverting output of said divide-by-two divider, and latches coupled to an output of said multiplexer and said non-inverting output of said flip flop to provide an M-bit digital word as said digital phase error signal.

7. A synthesizer according to claim 1 wherein said circuit means includes an amplifier-integrater circuit coupled between said digital to analog converter and said control input of said controlled oscillator.

8. A synthesizer according to claim 2 wherein said circuit means includes an amplifier-integrater circuit coupled between said digital to analog converter and said control input of said controlled oscillator.

9. A synthesizer according to claim 3 wherein said circuit means further includes an amplifier-integrater circuit coupled between said digital to analog converter and said control input of said controlled oscillator.

10. The synthesizer according to claim 3 wherein said ramp generator is further coupled to a reference frequency and said divider.

11. The synthesizer according to claim 4, wherein said circuit means further includes an amplifier-integrater circuit coupled between said digital to analog converter and said control input of said controlled oscillator.

12. The synthesizer according to claim 4 wherein said ramp generator is further coupled to a reference frequency and said divider.

* * * * *